United States Patent [19]

Baek

[11] Patent Number: 5,595,930
[45] Date of Patent: Jan. 21, 1997

[54] METHOD OF MANUFACTURING CCD IMAGE SENSOR BY USE OF RECESSES

[75] Inventor: Euy H. Baek, Chungcheongbuk-do, Rep. of Korea

[73] Assignee: LG Semicon Co., Ltd., Rep. of Korea

[21] Appl. No.: 507,202

[22] Filed: Jul. 26, 1995

[30] Foreign Application Priority Data

Jun. 22, 1995 [KR] Rep. of Korea ............... 16931/1995

[51] Int. Cl.[6] ............................................. H01L 21/339
[52] U.S. Cl. ....................... 437/53; 437/2; 437/228
[58] Field of Search ................... 437/2, 3, 50, 53, 437/228 PL, 249

[56] References Cited

U.S. PATENT DOCUMENTS

| | | | |
|---|---|---|---|
| 4,081,277 | 3/1978 | Brault et al. | 437/2 |
| 4,450,475 | 5/1984 | Ishikawa et al. | 348/276 |
| 4,481,530 | 11/1984 | Wagensonner et al. | 348/282 |
| 5,132,251 | 7/1992 | Kim et al. | 437/2 |
| 5,266,501 | 11/1993 | Imai | 437/53 |
| 5,350,490 | 9/1994 | Lee | 437/53 |

*Primary Examiner*—Chandra Chaudhari

[57] ABSTRACT

A charge coupled device (CCD) image sensor formed by producing hemispheric recesses in a lower planarizing layer in places corresponding to photodiodes and filling the recesses to form a dye layer. The recesses filled with dye serve as a concave lenses, which has the overall effect of reducing the height of the CCD as measured from the micro-lenses down to the photodiodes. By properly controlling the refractivity of the micro-lenses (to which the light is incident) and that of the dye layer serving as the concave lens, the light incident to the photodiodes advances with respect to the photodiodes, thus reducing a smear phenomenon and improving sensitivity of the CCD.

20 Claims, 4 Drawing Sheets

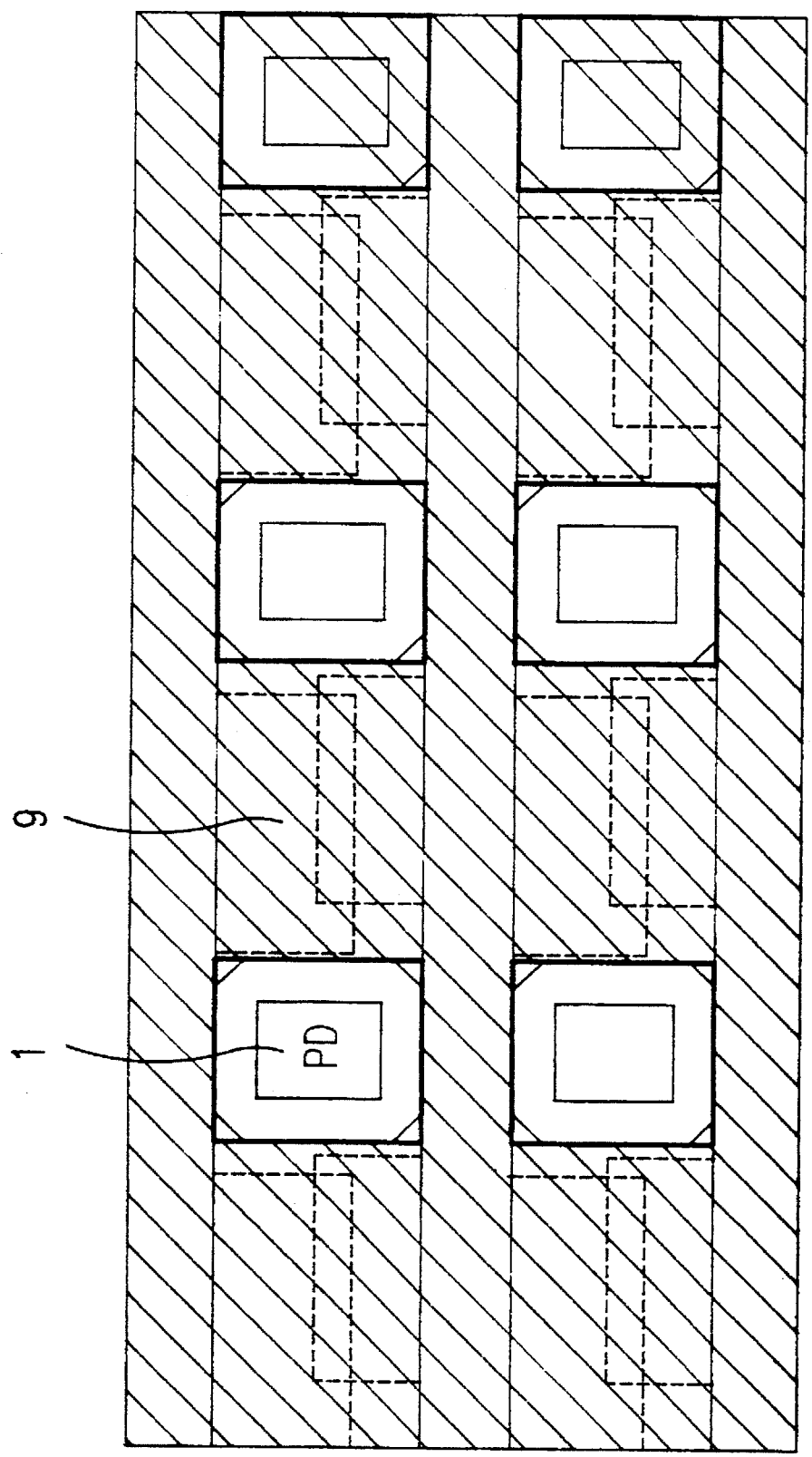

METHOD OF MANUFACTURING CCD IMAGE SENSOR BY USE OF RECESSES

BACKGROUND OF THE INVENTION

The present invention relates to an improved CCD image sensor and manufacturing method therefor.

FIG. 1 is a sectional view showing a conventional CCD image sensor. Here, a plurality of photoelectric conversion devices 1, i.e., photodiodes, are formed on a substrate while being spaced from one another by a predetermined distance, and a plurality of vertical charge coupled devices (hereinafter referred to as "VCCDs") 2 are formed between the photodiodes 1. A lower planarizing layer 3 is formed to allow the photodiodes 1 and VCCDs 2 to have a flat surface throughout the whole structure, and dye layers 4a, 4b and 4c are respectively formed on corresponding places on the lower planarizing layer 3. An upper planarizing layer 5 is formed on the dye layers 4a, 4b and 4c and exposed lower planarizing layer 3 to planarize overall surface of the resultant structure. Also, a plurality of hemispheric micro-lenses 6 are formed on the upper planarizing layer 5. A reference numeral 7 denotes a pad for dividing respective cells.

Typically, in the CCD image sensor, the lower planarizing layer 3 is coated on the photodiodes 1 and VCCDs 2, and, successively, the dye layers 4a, 4b and 4c are formed on the lower planarizing layer 3. At this time, the dye layers 4a, 4b and 4c are differently shaped from one another to make the whole surface uneven with the consequence of necessarily forming the upper planarizing layer 5 thereon.

Therefore, during the manufacturing of the CCD image sensor, since the height from the photodiodes 1 to the micro-lenses 6 is thickened, there is a problem that overall light transmissivity is degraded. Furthermore, due to the thick layer, it is apt to result in light loss or divergence when the light incident to the micro-lenses 6 is focused onto the photodiodes 1. In addition, the focusing rate thereof may be lowered owing to a scattering phenomenon of light.

SUMMARY OF THE INVENTION

The present invention is devised to eliminate the above-described problems. Accordingly, it is an object of the present invention to provide a CCD image sensor and manufacturing method therefor capable of increasing the focusing rate and transmissivity of light.

To achieve the above object of the present invention, there is provided a CCD image sensor and manufacturing method therefor, in which an isotropic etching is performed upon a lower planarizing layer to form dye layers in the shape of a concave lens, and micro-lenses are formed on an upper planarizing layer.

BRIEF DESCRIPTION OF THE DRAWINGS

The above objects and other advantages of the present invention will become more apparent by describing in detail preferred embodiments thereof with reference to the attached drawings in which:

FIG. 3 is a diagram showing the shape of a lens-forming mask according to the present invention.

DETAILED DESCRIPTION OF THE PREFERRED EMBODIMENT

Referring to FIG. 2, a process of manufacturing a CCD image sensor according to the present invention will be described.

Figure 1:
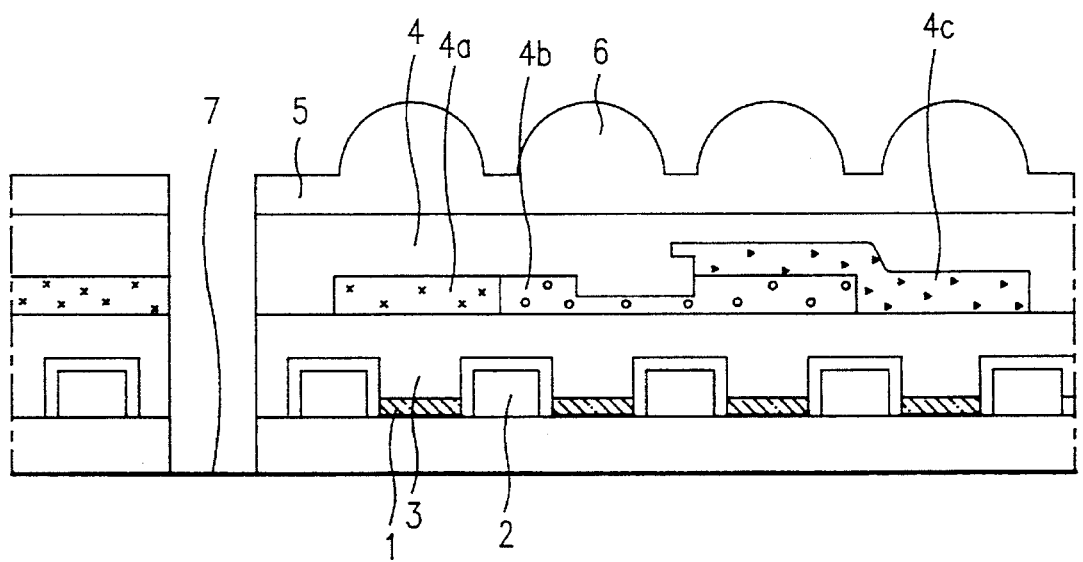
FIG. 1 is a sectional view showing a structure of a conventional CCD image sensor.
Figure 2A:
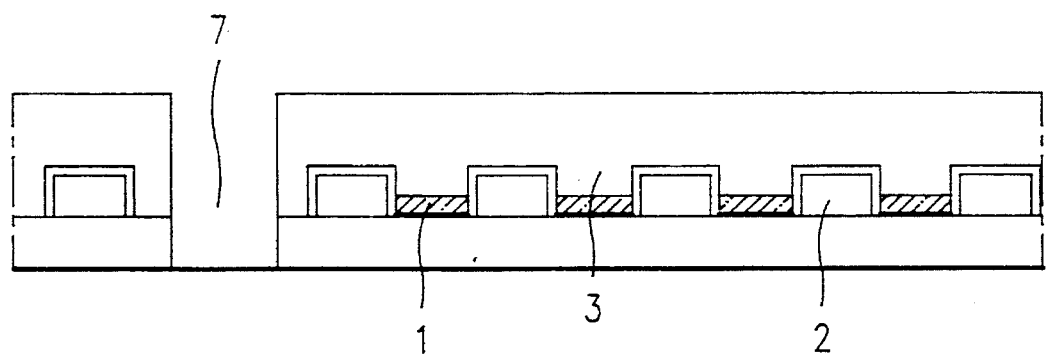
FIGS. 2A to 2H are sectional views showing a process of manufacturing a CCD image sensor according to the present invention.
Figure 2B:
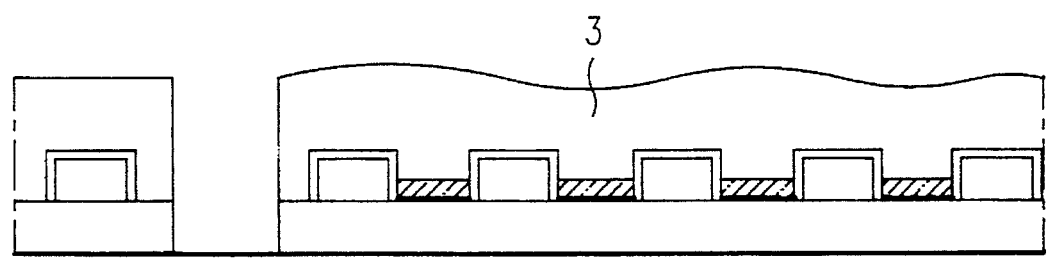
Figure 2C:
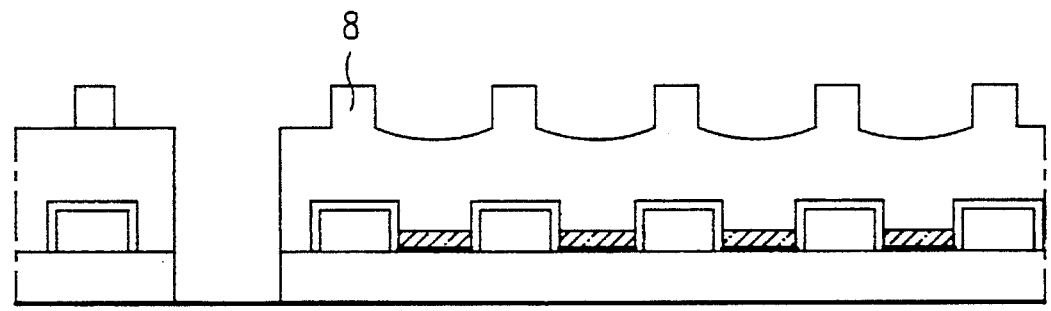
Figure 2D:
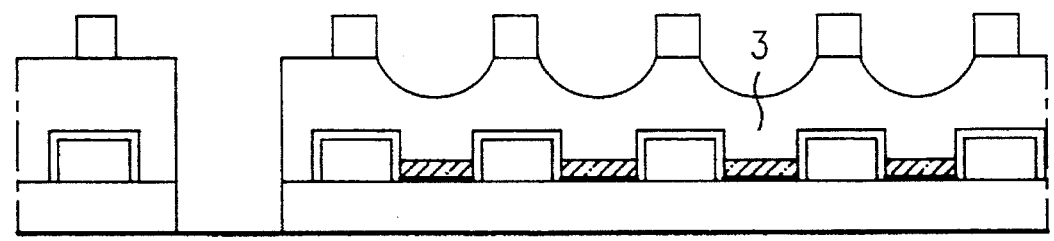
Figure 2E:
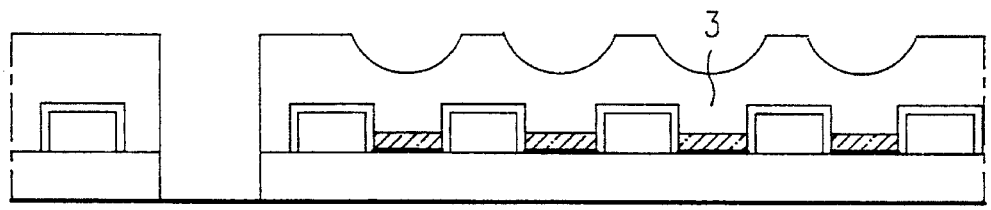
Figure 2F:
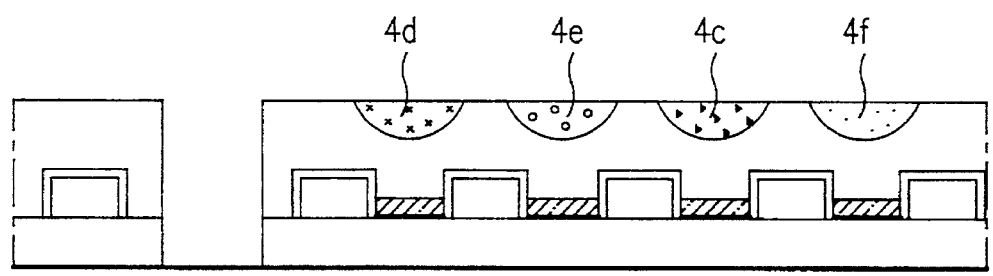

As shown in FIG. 2A, a plurality of photodiodes 1 are formed on a substrate while being spaced from one another by a predetermined distance, and a plurality of VCCDs 2 are formed on the substrate between the photodiodes 1. A lower planarizing layer 3 including a polyimide-based material having a superior heat-resistance which is a poly-condensate derived from an anhydride and aromatic thiamine to promerite acid is coated on the photodiodes 1, VCCDs 2 and exposed substrate. Then, as shown in FIG. 2B, the material of the polyimide group is thermally hardened at 200° C. to be solid. As shown in FIG. 2C, a photoresist 8 is coated on the upper portion of the VCCDs 2 to be narrower than the VCCDs, and is subjected to an etching mask operation is performed via a photolitography. Referring to FIG. 2D, an isotropic etching is performed to etch the lower planarizing layer 3 to be shaped as a plurality of hemispheric concave lenses. Thereafter, the photoresist 8 is removed as shown in FIG. 2E. Thus, only the lower planarizing layer 3 etched as the hemispheric concave lenses is left to provide a structure for fabricating a succeeding color CCD. Referring to FIG. 2F, a dye layer of a highly polymerized compound is subjected to a color spray and dyeing methods to form dye layers 4d, 4e, 4c and 4f in colors of magenta 4d, cyan 4e, yellow 4c and green 4f. In the conventional technique, the dye layer is stacked to increase overall CCD thickness as accumulating the colors. However, the CCD according to the present invention adopts a method for forming the die layer in the lower planarizing layer 3, so that the total height of the CCD can be reduced so much.

Figure 2G:
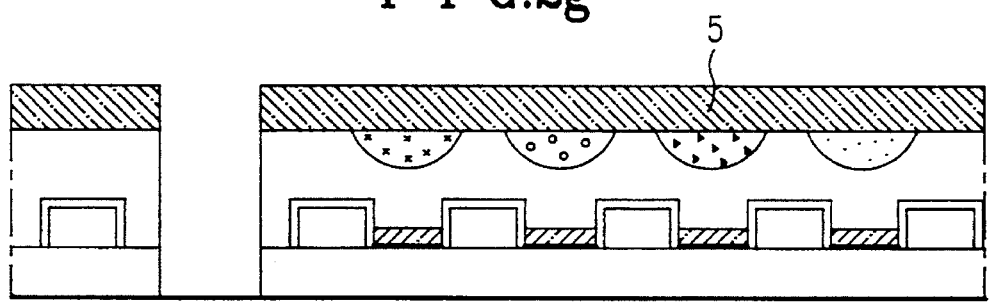
Figure 2H:
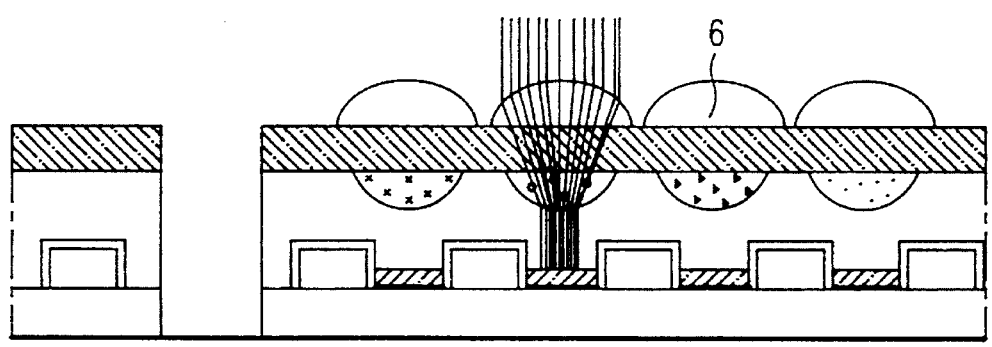

As shown in FIG. 2G, an upper planarizing layer 5 is formed to perpendicularly focus incident light to the curvature of the concave lens formed by the dye layer 4 and the plane of the photodiodes 1 which is the light-receiving portion, and micro-lenses 6 are formed to have a curvature to perpendicularly focus the incident light to the photodiodes 1 as shown in FIG. 2H.

At this time, the larger radius of curvature is preferable in the micro-lenses 6 since the light-receivable range is enlarged, and a material constituting the micro-lens preferably has a smaller refractivity. Also, a materials constituting the upper planarizing layer 5 and dye layer 4 preferably have the refractivity larger than that of the micro-lens 6, in other words, more than 2.0. The radius of curvature of the concave lens in contact with the dye layer 4 is smaller than that of the micro-lens 6 as compared with the area of the photodiode 1 which is the light-receiving portion. By this construction, the incident light passing through the concave lens does not exceed the area of the photodiode 1, and the larger refractivity than that of the micro-lens is effective.

FIG. 3 shows the mask pattern 9 according to the present invention, in which the corner of the rectangular mask is shaped as a triangle. Consequently, when the isotropic etching is performed to form the dye layers 4d, 4e, 4c and 4f, a hemispheric recesses are produced. By spraying colors into the recesses provide the layers of magenta 4d, cyan 4e, yellow 4c and green 4f, the color dye layer is completed.

With respect to the operation of the CCD according to the present invention, the incident light advances to the micro-lens 6 perpendicular to the upper planarizing layer 5, and the micro-lens 6 refracts and focuses the incident light in accordance with its own refractivity. The focused incident light is refracted by the concave lens in contact with the dye layer 4. The refracted incident light advances perpendicular to the photodiode 1 to thereby reducing smear and maximizing sensitivity.

The CCD image sensor and manufacturing method therefor as described above provides a dye layer and a micro-lens that are lightweight and thin, thereby permitting enhanced miniaturization of a chip, i.e., higher density and higher integration of the chip. Here, the lower planarizing layer 3, under the conventional color filter layer, is formed as the hemispheric concave lens to involve the dye layer 4, so that the overall height from the micro-lens 6 to the photodiode 1 is lowered, thereby improving the transmissivity so much. Furthermore, since the dye layer 4 (formed in the hemispheric recess obtained by etching the planarizing layer 3) functions as the concave lens, the micro-lens (6 which is the uppermost layer) receives the light advancing perpendicular, with respect to the upper planarizing layer 5, to allow the light to be perpendicularly incident to the plane of the photodiode 1, thereby preventing the smear phenomenon of a picture and improving the sensitivity.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A method of manufacturing a CCD image sensor comprising the steps of:
   a) forming a plurality of photoelectric conversion devices on a substrate spaced from one another by a predetermined distance;
   b) forming a plurality of vertical charge coupled devices between said photoelectric conversion devices;
   c) coating a lower planarizing layer on the surface of the exposed substrate, said photoelectric conversion devices and said vertical charge coupled devices;
   d) thermally hardening said lower planarizing layer;
   e) performing an etching mask operation by coating a photoresist layer onto said thermally-hardened lower planarizing layer;
   f) performing an isotropic etching upon the resultant structure subjected to said etching mask operation;
   g) forming a plurality of hemispheric recesses by said isotropic etching;
   h) removing said photoresist layer after finishing said isotropic etching;
   i) forming a dye layer by dyeing said plurality of hemispheric recesses in said lower planarizing layer by means of a plurality of colors;
   j) forming an upper planarizing layer on said dye layer; and
   k) forming micro-lenses having a proper refractivity on said upper planarizing layer respectively corresponding to said photoelectric conversion devices.

2. A method for manufacturing a CCD as claimed in claim 1, wherein:
   the photoresist layer has openings;
   wherein each opening is centered over a vertical charge coupled device;
   wherein an opening has an octagonal shape having four long sides and four short sides such that the octagonal shape is substantially rectangular, thereby enabling the step f) to produce the circular opening of the hemispheric recess in the lower planarizing layer.

3. A method of manufacturing a CCD image sensor, the method comprising the steps of:
   a) providing a substrate;
   b) forming a plurality of photoelectric conversion devices on the substrate;
   c) forming a plurality of charge coupled devices between said photoelectric conversion devices on the substrate;
   d) forming, after the steps b) and c), a lower planarizing layer on the substrate, said photoelectric conversion devices and said charge coupled devices;
   e) forming a plurality of recesses in the lower planarizing layer;
   f) forming a dye layer in said plurality of recesses in said lower planarizing layer;
   g) forming an upper planarizing layer on said dye layer and said lower planarizing layer; and
   h) forming micro-lenses on said upper planarizing layer such that the micro-lenses are correspondingly located to said photoelectric conversion devices.

4. A method as in claim 3, wherein the step b) includes:
   b1) spacing each photoelectric conversion device a predetermined distance apart from another photoelectric conversion device.

5. A method as in claim 3, wherein:
   the charge coupled devices of the step c) are vertical charge coupled devices.

6. A method as in claim 3, wherein the step d) includes:
   d1) hardening the lower planarizing layer.

7. A method as in claim 6, wherein:
   the step d1) is thermal hardening.

8. A method as in claim 3, wherein the step e) includes:
   e1) forming a mask onto the lower planarizing layer;
   e2) etching areas of the lower planarizing left exposed by the mask; and
   e3) removing the mask.

9. A method as in claim 8, wherein:
   the step e2) is isotropic etching.

10. A method as in claim 8, wherein:
    the mask has CCD-portions; and
    wherein the mask is configured so that each charged coupled device is covered by a CCD-portion,
    the area of a CCD-portion is less than an area of a charge couple device such that a CCD-portion incompletely covers a charge coupled device.

11. A method as in claim 8, wherein:
    the mask has openings;
    wherein each opening is centered over a charge coupled device;
    wherein an opening has an octagonal shape having four long sides and four short sides such that the octagonal shape is substantially rectangular, thereby enabling the step e2) to produce a recess that is substantially circular at the upper surface of the lower planarizing layer.

12. A method as in claim 3, wherein:
    the recesses of the step e) are hemispheric recesses.

13. A method as in claim 3, wherein:
    the step f) forms a plurality of dyes in the dye layer.

14. A method as in claim 13, wherein the plurality of dyes includes:
    a magenta dye;

a cyan dye;

a yellow dye; and a green dye.

15. A method as in claim 3, wherein the step f) includes:

f1) filling in the recesses with the dye layer such that the lower planarizing layer and the dye layer combine to form a substantially flat surface.

16. A method as in claim 3, wherein:

the step h) forms micro-lenses having a non-hemispheric radius of curvature.

17. A method as in claim 3, wherein:

the step h) centers the micro-lenses over the charge coupled devices.

18. A method as in claim 3, wherein:

the step h) forms micro-lenses having a radius of curvature that is greater than a radius of curvature of the recesses.

19. A method as in claim 3, wherein:

the micro-lenses have a refractivity that is smaller than a refractivity of the upper planarizing surface.

20. A method as in claim 19, wherein:

the micro-lenses have a refractivity that is smaller than a refractivity of the dye layer.

* * * * *